Dec. 16, 1969 J. A. CAMPO 3,483,610
THERMOCOMPRESSION BONDING OF FOIL LEADS
Filed June 8, 1967
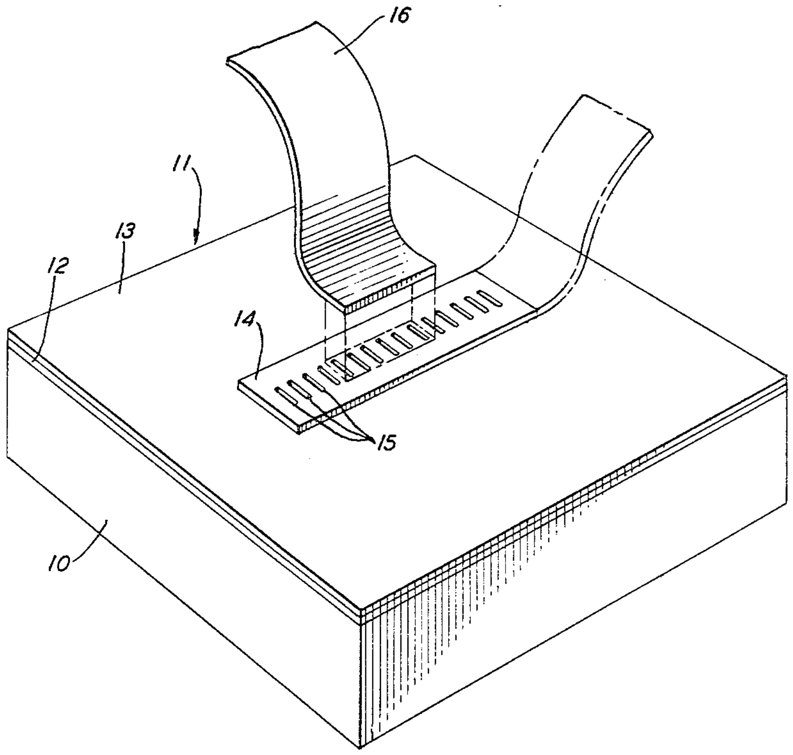
INVENTOR
J. A. CAMPO
BY George S. Indig
ATTORNEY United States Patent Office 3,483,610
Patented Dec. 16, 1969

3,483,610
THERMOCOMPRESSION BONDING OF FOIL LEADS

James A. Campo, Liverpool, N.Y., assignor to Bell Telephone Laboratories, Incorporated, Murray Hill, N.J., a corporation of New York Filed June 8, 1967, Ser. No. 644,731
Int. Cl. B23k *31/02*
U.S. Cl. 29—497 5 Claims

ABSTRACT OF THE DISCLOSURE

A method is disclosed for reproducibly attaching gold foils to gold surfaced quartz substrates by a thermocompression bonding technique. Substrate chipping and the problem of weakly adherent surfacing are avoided by use of thin foils and a novel lead configuration.

This invention generally relates to a method for thermocompression bonding and to the bonds produced thereby, and more particularly, to a method for thermocompressively bonding gold foils to gold-plated quartz substrates.

BACKGROUND OF THE INVENTION

A common material in general use in the electronic and communications fields is quartz, bothin its crystalline and fused form. Exemplary uses are those in delay lines, oscillator circuits, electrical filters, etc. Some of these uses may take advantage of the piezoelectric properties of crystalline quartz; others may simply utilize the low acoustic loss property of quartz in, say, its fused state where it would not exhibit any piezoelectric property. In these and other uses, it is often necessary that some form of electrical connection be made to the quartz. At present, soldering techniques are generally employed for this purpose. Basically, this entails depositing an electrode layer, usually gold or some other like metal on the quartz substrate and soldering the electrical lead to the layer. Soldering, unfortunately, has some disadvantages: the flux used typically leaves a corrosive residue which in time attacks and weakens the soldered bond; since the solder is low-melting, the temperature environment during use of the completed device is limited; also, whiskers of the soldering material tend to grow and these often short out adjacent circuitry. Other problems associated with soldering are well known to the art.

For some time an alternative to the solder method has been sought for the quartz system. Thermopression bonding has been under investigation for some time and holds great promise. But the high temperatures and pressures employed by this method may degrade the underlying quartz, causing it to chip or crack either during the bonding process or subsequent to it during a pull-test or actual use. Often whole segments of the quartz, with electrode layer and bonded leads, separate.

A related problem is that the plating which makes up the electrode layer often becomes less adherent to the quartz, seemingly as the result of the severe thermocompression bonding conditions. One solution to this problem is described in U.S. Patent 3,296,692, issued to J. P. Griffin, and entails using an electrode layer of aluminum or titanium, which materials seem to form particularly strong bonds with crystalline quartz. Unfortunately, where gold is preferred as the electrode material because of its inert chemical nature, or for other reasons, the method of Griffin is not adequate.

SUMMARY OF THE INVENTION

In accordance with the invention, a method of thermocompressively bonding gold foil to gold plated quartz substrates has been found which does not result in either quartz chipping or a weakly adherent plating. The inventive method employs a nominal temperature range of about 325 to 700° C., a nominal pressure of about 2000 to 4500 p.s.i. and a time interval for the application of both temperature and pressure of approximately 1 to 3 seconds. Preferably, these conditions are applied to gold foils of a thickness in the range from about 0.5 to 2.5 mils to achieve bonds reproducibly without substrate chipping.

The related problem of weakly adherent plating is solved by a preferred embodiment of the invention, in which a first portion of gold foil is bonded to gold plated quartz, and a second portion of gold foil is bonded to the first to form a novel extended area lead, both bonding steps being in accordance with the conditions set forth above. The lead so formed distributes forces normal to the electrode surface in a maner which significantly increases the plating resistance to such forces.

In a further preferred embodiment, the gold foil portion to be bonded and the substrate surface to which it is to be bonded, whether gold foil or gold plating, are burnished, as with a highly polished agate tip, for example.

DESCRIPTION OF THE DRAWING

The invention will be further disclosed and particularized in the following detailed description in conjunction with the accompanying drawing in which is shown a perspective view, partially exploded, of a gold plated quartz substrate having bonded to it an extended area gold foil lead.

DETAILED DESCRIPTION OF THE INVENTION

The drawing depicts a plated quartz substrate with foil leads thermocompressively bonded thereto in accordance with the invention.

Quartz substrate 10 is coated with an electrode layer 11 which consists of chromium layer 12 and gold layer 13. Chromium is known to provide a good intermediate layer between gold films and quartz substrates. However, the use of any such intermediate layer is not essential to the inventive bonding technique and novel extended area lead. Electrode layer 11 can be deposited by any known technique such as by vapor deposition, sputtering, etc. Nominally chromium layer 12 is 300 to 700 A. in thickness and is covered by gold layer 13 of a thickness from 1500 to 10,000 A. Materials other than chromium that are suitable for this purpose may be employed instead.

Gold foil is thermocompressively bonded to electrode 11 by the use of a suitable bonding tip. An Iconel tip 10 x 50 mils in size at the point proves to be excellent. Base gold foil 14 is bonded to electrode layer 11 by a succession of individual applications of the bonding tip which is heated to the bonding temperature (325 to 700° C.) and which presses on the foil at the required bonding pressure (2000 to 4500 p.s.i.) for the required time (approximately 1 to 3 seconds). The individual bonding points are designated in the figure as shaded areas 15.

As noted earlier, the gold foil being bonded is preferably not greater than approximately 2.5 mils in thickness. Within this limitation on thickness, the underlying quartz substrate 10 does not chip or crack under the bonded area. At greater thicknesses, however, the substrate oftentimes does chip. It is theorized that chipping is basically the result of the forces created by the foil as it cools and contracts, pulling the local substrate with it. If such is indeed the case, then a thicker foil creates greater forces and hence greater damage. In any event, this theory is by way of explanation only and is not intended to be a limitation of the inventive method. Of course, should it be desired to do so, thicker foils may be bonded with lessened reproducibility of the bonds produced. Reasonable success is achieved up to 5 mils. Very thin foils should be bondable in accordance with the inventive techniques, but as a practical matter foils less than 0.5 mil are not usually employed.

If it is desired to employ only one foil portion as the ultimate lead to electrode layer 11, it would be desirable to have base gold foil 14 at an extended length as indicated by dashed lines in FIG. 1. The extended length is not itself bonded to electrode layer 11 and is free to be positioned according to the geometry of the remainder of the device.

It has also been observed that improvement in the strength of the bond is achieved when at least one, and preferably both, of the surfaces to be in contact are burnished before bonding is carried out. Burnishing can be conveniently accomplished by rubbing the surfaces with a highly polished tip, for example an agate tip.

As noted earlier, the electrode layer oftentimes becomes less adherent to the quartz, seemingly as a result of the bonding conditions. It has been discovered that the resistance of the electrode layer bond to pulling forces can be significantly increased by utilizing base gold foil 14 merely as an intermediate layer for receiving and stationing gold foil lead 16, shown as exploded in the drawing. Gold foil lead 16, when thermocompressively bonded to base gold foil 14, forms a novel extended area lead, i.e., base gold foil 14 is an extension of gold foil lead 16 into the plane of electrode layer 11. The use of such an extended area lead unexpectedly results in an extremely strong overall lead which can be reproducibly manufactured. The thermocompressive method for bonding gold foil lead 16 to base gold foil 14 is identical to that used in bonding the latter to electrode layer 11, viz., the thickness of gold foil lead 16 is preferably not greater than 2.5 mils, temperature is within the 325 to 700° C. range, the pressure applied is from 2000 to 4500 p.s.i., and the time interval is approximately 1 to 3 seconds. The bonding tip can be the same as that employed in the first bonding step.

The bond formed between gold foil lead 16 and base gold foil 14 is quite strong, and the extended area lead thus formed so distributes pulling forces normal to electrode layer 11 that it remains adherent even under substantial pulls. By way of explanation, it is reasoned that the elastic nature of the base foil acts to favorably distribute normal forces longitudinally in the plane of the electrode layer.

Preferably, gold foil lead 16 is positioned in the center of base foil 14, away from the latter's edges, in order to take maximum advantage of this effect.

Further improvement in the strength of all bonds associated with the extended area lead is obtained by burnishing those surfaces to be contacted in bonding.

The following example sets forth the particular conditions for making an extended area lead by the method of the invention.

EXAMPLE

A face of a fused quartz portion, 11 x ½ inches in area, was plated with a 500 A. thick layer of chromium and a 2000 A. thick layer of gold.

A portion of gold foil, ½ inch long, 60 mils wide and 1 mil thick was cleaned in alcohol and methylethylketone to remove oily residues and was burnished by light rubbing with a polished agate tip, as was the deposited gold plating in the area to be bonded. This portion of gold foil was thermocompressively bonded to the gold layer by successive applications of a 10 x 50 mil Iconel tip for 2 seconds at 350° C. and 4000 p.s.i. The 10 mil wide tip was applied along the length of the foil at 10 mil intervals, thus necessitating 25 individual applications to completely bond the length of the foil.

The foil thus in place was cleaned and burnished, as was a second portion of gold foil, in the manner just described. The second foil, 1 inch long, ¼ inch wide, and 1 mil thick, was thermocompressively bonded to the already bonded foil under the same conditions alluded to above, to form the extended area lead of the drawing. Successive applications of the 10 mil wide bonding tip were made without leading unbonded intervals, thus requiring about 25 individual tacking steps.

The completed lead was subjected to a pulling force normal to the plane of the electrode layer—this was the most severe direction for a pull force. Up to 2 pounds-force was applied at which point the foil itself failed, leading intact the electrode layer as well as the portions of gold bonded in accordance with the invention.

The invention has been described with reference to a few particular embodiments thereof, but it is intended that variations therefrom which basically rely on the teachings of the invention are to be considered as within the scope of the appended claims.

What is claimed is:

1. A method for bonding gold foil to a gold surfaced quartz substrate comprising the steps of providing a layer of gold on the quartz substrate, contacting at least a portion of the gold layer with a gold foil, and applying to a point of contact a bonding tip at a temperature within the range of 325 to 700° C., and at a pressure of about 2000 to 4500 p.s.i., for approximately 1 to 3 seconds.

2. The method of claim 1 wherein said gold foil is from 0.5 to 2.5 mils in thickness.

3. The method of claim 1 wherein said gold layer is of a thickness in the range of 1500 to 10,000 A.

4. A method in accordance with the method of claim 1 with the added steps of contacting said gold foil, after applying the bonding tip, with an additional portion of gold foil, and applying to a point of contact a bonding tip at a temperature within the range of 325 to 700° C., and at a pressure of about 2000 to 4500 p.s.i., for approximately 1 to 3 seconds.

5. The method of claim 4 wherein said gold foils and said gold layer are subjected to burnishing prior to contacting.

References Cited

UNITED STATES PATENTS

| | | | |
|---|---|---|---|
| 3,006,067 | 10/1961 | Anderson et al. | 29—498 X |
| 3,224,072 | 12/1965 | Summers et al. | 29—497.5 X |
| 3,235,945 | 2/1966 | Hall et al. | 29—497.5 X |
| 3,397,451 | 8/1968 | Avedissian et al. | 29—497.5 X |

JOHN F. CAMPBELL, Primary Examiner

J. L. CLINE, Assistant Examiner

U.S. Cl. X.R.

29—472.9, 497.5, 504; 228—3